(12) United States Patent
Flachowsky et al.

(10) Patent No.: US 9,006,045 B2
(45) Date of Patent: Apr. 14, 2015

(54) TRANSISTOR INCLUDING A GATE ELECTRODE EXTENDING ALL AROUND ONE OR MORE CHANNEL REGIONS

(71) Applicant: GLOBALFOUNDRIES Inc., Grand Cayman (KY)

(72) Inventors: Stefan Flachowsky, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 152 days.

(21) Appl. No.: 13/792,950

(22) Filed: Mar. 11, 2013

(65) Prior Publication Data

US 2014/0252481 A1    Sep. 11, 2014

(51) Int. Cl.
*H01L 21/00* (2006.01)
*H01L 21/84* (2006.01)
*H01L 29/786* (2006.01)
*H01L 29/66* (2006.01)

(52) U.S. Cl.
CPC .... *H01L 29/78609* (2013.01); *H01L 29/66742* (2013.01)

(58) Field of Classification Search
CPC .............. H01L 29/66742; H01L 29/78609
USPC ................... 438/149, 151; 257/349
See application file for complete search history.

(56) References Cited

U.S. PATENT DOCUMENTS

2009/0061572 A1*  3/2009  Hareland et al. ............. 438/157
2011/0291196 A1   12/2011  Wei et al.

\* cited by examiner

*Primary Examiner* — Theresa T Doan
(74) *Attorney, Agent, or Firm* — Amerson Law Firm, PLLC

(57) ABSTRACT

A semiconductor structure comprises a substrate and a transistor. The transistor comprises a raised source region and a raised drain region provided above the substrate, one or more elongated semiconductor lines, a gate electrode and a gate insulation layer. The one or more elongated semiconductor lines are connected between the raised source region and the raised drain region, wherein a longitudinal direction of each of the one or more elongated semiconductor lines extends substantially along a horizontal direction that is perpendicular to a thickness direction of the substrate. Each of the elongated semiconductor lines comprises a channel region. The gate electrode extends all around each of the channel regions of the one or more elongated semiconductor lines. The gate insulation layer is provided between each of the one or more elongated semiconductor lines and the gate electrode.

20 Claims, 9 Drawing Sheets

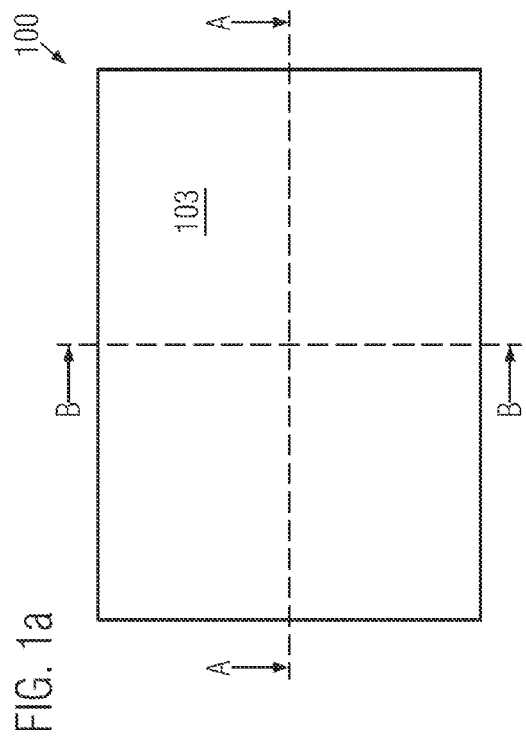
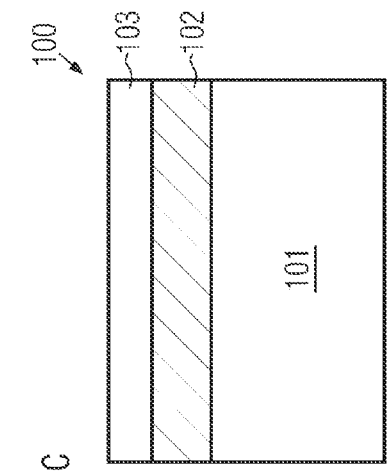
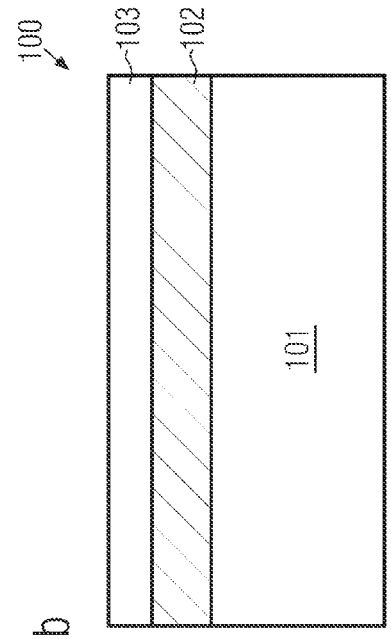

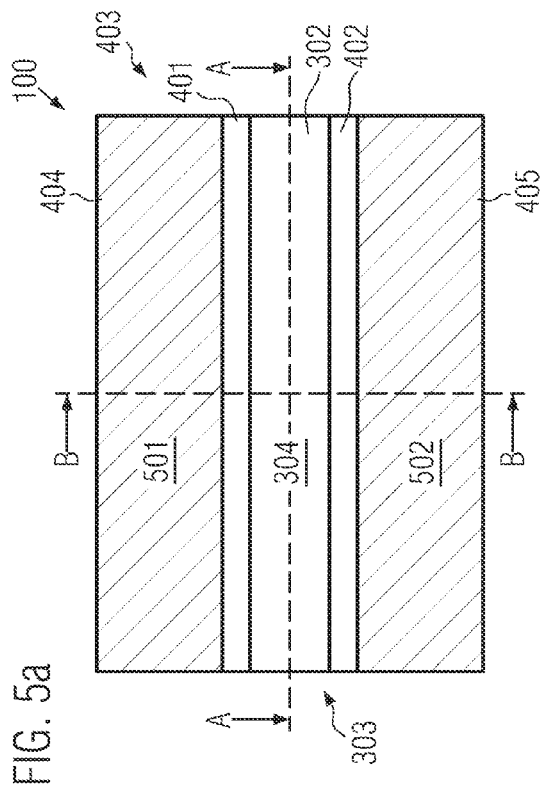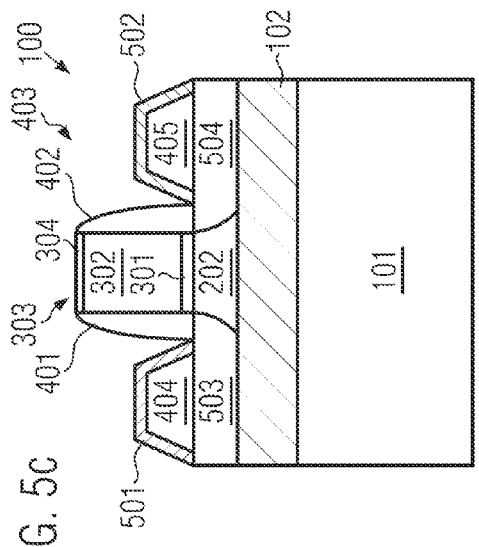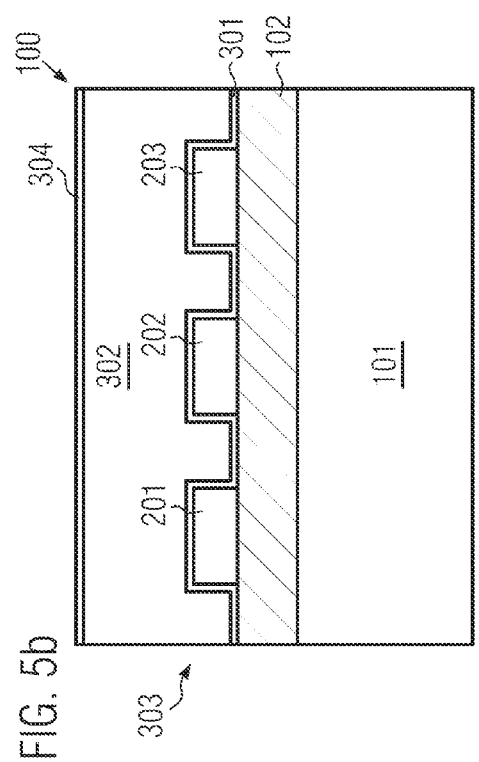

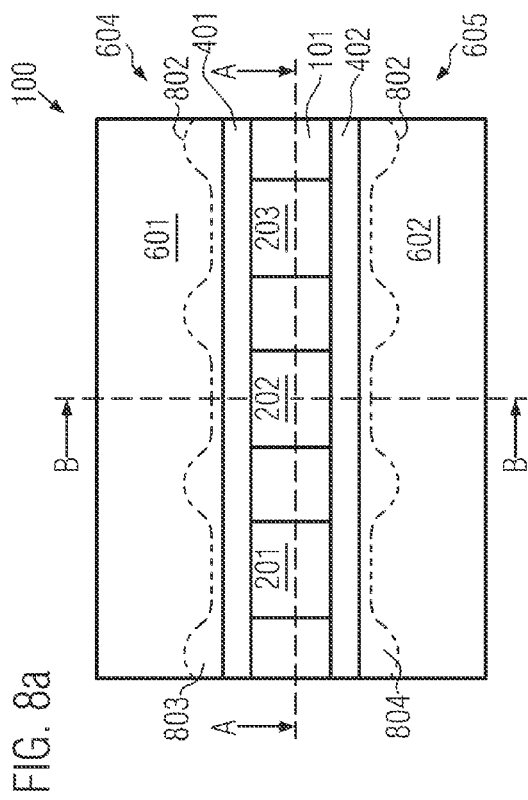
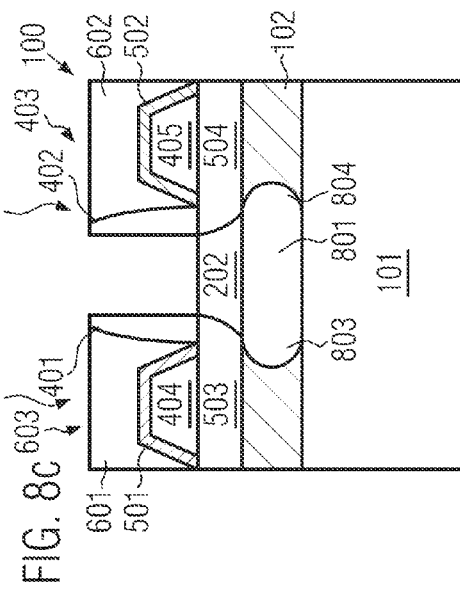
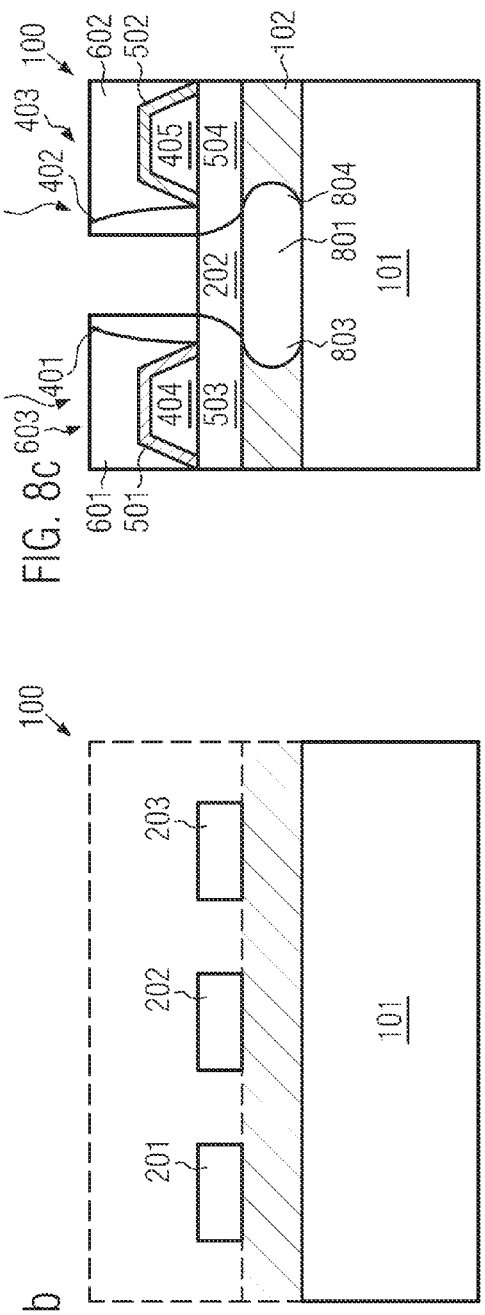

TRANSISTOR INCLUDING A GATE ELECTRODE EXTENDING ALL AROUND ONE OR MORE CHANNEL REGIONS

BACKGROUND OF THE INVENTION

1. Field of the Invention

Generally, the present disclosure relates to the field of integrated circuits and, more particularly, to integrated circuits wherein semiconductor-on-insulator techniques are employed.

2. Description of the Related Art

Integrated circuits typically include a large number of circuit elements, which include, in particular, field effect transistors. In a field effect transistor, a gate electrode may be separated from a channel region by a gate insulation layer that provides an electrical insulation between the gate electrode and the channel region. Adjacent the channel region, a source region and a drain region are provided.

The channel region, the source region and the drain region are formed in a semiconductor material, wherein the doping of the channel region is different from the doping of the source region and the drain region. Depending on an electric voltage applied to the gate electrode, the field effect transistor may be switched between an on-state and an off-state.

For improving the performance of integrated circuits including field effect transistors, it has been proposed to employ semiconductor-on-insulator technology. In semiconductor-on-insulator technology, the source, channel and drain regions of transistors are formed in a thin layer of a semiconductor material, for example, silicon. The thin layer of semiconductor material may be provided above a substrate of a semiconductor material, for example, silicon, and may be separated from the substrate by an electrically insulating material, for example, silicon dioxide. Compared to integrated circuits wherein field effect transistors are formed on a bulk semiconductor substrate, semiconductor-on-insulator technology may allow reducing parasitic capacitances and leakage currents and a sensitivity of integrated circuits with respect to ionizing radiation.

However, semiconductor-on-insulator technology has some specific issues associated therewith, which include the so-called floating body effect. The body of a semiconductor-on-insulator field effect transistor forms a capacitor with the substrate. On this capacitor, electric charge may accumulate and cause adverse effects, including a dependence of the threshold voltage of the field effect transistor on its previous states and a reduced controllability of the channel.

US 2011/0291196 A1 discloses a semiconductor device that includes a FinFET or tri-gate transistor on the basis of a semiconductor-on-insulator substrate. The semiconductor device includes a silicon substrate, above which is formed a buried insulation layer, typically in the form of a silicon dioxide material. Furthermore, a plurality of semiconductor fins are provided and represent the "residues" of a silicon layer initially formed on the buried insulating layer. The fins include a source region, a drain region and a channel region. The extension of the channel region along the length direction of the fins is determined by a gate electrode structure including an electrode material, such as polysilicon, and a spacer structure. A gate dielectric material separates the electrode material from the semiconductor material of the channel region at the sidewalls of the fins and, in the case of a tri-Gate transistor, on the top surface of the fins.

Compared to planar field effect transistors, transistors wherein the channel region is formed in fins may have an improved controllability of the channel. However, for some applications, for example for forming transistors in integrated circuits according to the 22 nm technology node and beyond, it may be desirable to provide still further improvements of the controllability of the channel of a transistor.

The present disclosure provides a semiconductor structure including a transistor having an improved controllability of the channel and a method for forming such a transistor.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative semiconductor structure disclosed herein includes a substrate and a transistor. The transistor includes a raised source region and a raised drain region provided above the substrate, one or more elongated semiconductor lines, a gate electrode and a gate insulation layer. The one or more elongated semiconductor lines are connected between the raised source region and the raised drain region. A longitudinal direction of each of the one or more elongated semiconductor lines extends substantially along a horizontal direction that is perpendicular to a thickness direction of the substrate. Each of the elongated semiconductor lines includes a channel region. The gate electrode extends all around each of the channel regions of the one or more elongated semiconductor lines. The gate insulation layer is provided between each of the one or more elongated semiconductor lines and the gate electrode.

An illustrative method disclosed herein includes forming one or more elongated semiconductor lines on a layer of electrically insulating material. The layer of electrically insulating material is provided over a substrate including a different material than the layer of electrically insulating material. A longitudinal direction of each of the one or more elongated semiconductor lines extends substantially along a horizontal direction that is perpendicular to a thickness direction of the substrate. A portion of the layer of electrically insulating material below a central portion of each of the one or more elongated semiconductor lines is removed. A gate insulation layer is formed on the central portion of each of the one or more elongated semiconductor lines. A gate electrode that extends all around the central portion of each of the one or more elongated semiconductor lines is formed. The gate insulation layer provides electrical insulation between the elongated semiconductor lines and the gate electrode.

BRIEF DESCRIPTION OF THE DRAWINGS

The disclosure may be understood by reference to the following description taken in conjunction with the accompanying drawings, in which like reference numerals identify like elements, and in which:

FIGS. 1a, 1b and 1c show a schematic top view and cross-sectional views, respectively, of a semiconductor structure according to an embodiment in a stage of a method according to an embodiment;

FIGS. 5a, 5b and 5c show a schematic top view and cross-sectional views, respectively, of a semiconductor structure according to an embodiment in a stage of a method according to an embodiment;

FIGS. 8a, 8b and 8c show a schematic top view and cross-sectional views, respectively, of a semiconductor structure according to an embodiment in a stage of a method according to an embodiment.

Figure 2C:
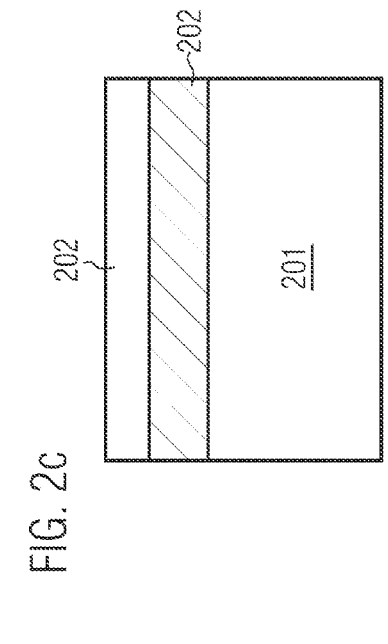
FIGS. 2a, 2b and 2c show a schematic top view and cross-sectional views, respectively, of a semiconductor structure according to an embodiment in a stage of a method according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides transistors and methods for the formation thereof wherein highly controllable and stable elongated semiconductor lines (which may also be denoted as "nanowires," in particular in embodiments wherein the elongated semiconductor lines have relatively small diameters of, for example, about 10 nm or less) with a clearly defined orientation and length may be provided. Furthermore, the present disclosure provides a gate formation (optionally using a high-k gate insulation material and a metal gate electrode) wherein the elongated semiconductor lines are coated completely, with the exception of end portions providing electrical connection to other portions of the transistor such as, for example, a raised source region and a raised drain region. Thus, a gate-all-around configuration allowing a high degree of gate control may be obtained. This may enable the use of higher drive currents in the on-state of the transistor and lower leakage currents in the off-state of the transistor.

The present disclosure provides a fabrication flow for a transistor device wherein a channel region is provided in an elongated semiconductor line with an all-around gate electrode. The starting material may be an extremely thin semiconductor-on-insulator wafer, for example a semiconductor-on-insulator wafer wherein the top silicon layer has a thickness in a range from about 5-8 nm, and a thickness of an underlying oxide insulation layer is in a range from about 10-20 nm. The top silicon layer may be structured into thin stripes using photolithography, wherein a width of the stripes may be in the same range as the thickness of the silicon layer, for example in a range from about 5-8 nm for nanowire applications, but it may be wider in order to produce other devices.

On top and around the silicon stripes, a dummy gate structure may be formed. The dummy gate structure may include a dummy oxide having a thickness in a range from about 2-3 nm and a thicker polysilicon, which may have a thickness in a range from about 40-60 nm on top and around the silicon stripes. Adjacent the dummy gate structure, a protection spacer may be formed. Then, silicon may be grown using a selective epitaxial growth process to form raised source and drain regions. In the selective epitaxial growth process, the protection spacer may prevent silicon growth at the gate. The silicon grown in the selective epitaxial growth process may be in situ doped, so that no subsequent implantation and activation anneal is needed. Thereafter, a silicide may be formed at locations where silicon is exposed. The dummy gate structure may be completely encapsulated, for example with silicon nitride, so that silicide is formed only on the raised source and drain regions.

Thereafter, the structure may be covered with a relatively thick layer of silicon dioxide. The silicon dioxide may be formed by means of a chemical vapor deposition process or plasma enhanced chemical vapor deposition process wherein a reactant gas including tetraethyl orthosilicate (TEOS) is used. The silicon dioxide may be planarized by means of chemical mechanical polishing until the dummy gate structure is exposed. Then, the dummy gate structure, including polysilicon and the dummy oxide, may be removed by using a selective etching.

Thereafter, the partly exposed elongated semiconductor line may be completely exposed using a selective oxide etching step which removes the oxide from the extremely thin semiconductor-on-insulator wafer underneath the elongated semiconductor line. Thus, the elongated semiconductor line is completely free "hanging" between the source and drain regions. The amount of etching may be adapted such that not too much silicon dioxide is removed under the raised source and drain regions but enough to clear the oxide from the elongated semiconductor line completely.

Then, a dielectric material may be formed using a process which also allows growing dielectric material at the bottom side of the elongated semiconductor lines. This may be done by creating a thermally grown silicon dioxide, but high-k materials may also be used. High-k materials may have advantages in terms of lower gate leakages.

Thereafter, a gate electrode, for example a metal gate electrode, may be formed. The gate electrode may completely fill the etched area within the oxide layer of the extremely thin semiconductor-on-insulator wafer in order to avoid any air voids in the device, which could be sources of defects or leakage path.

Thereafter, contact and backend wiring may be manufactured in accordance with standard semiconductor processing techniques.

FIG. 1a shows a schematic top view of a semiconductor structure 100 according to an embodiment in a stage of a manufacturing process according to an embodiment. FIG. 1b shows a schematic cross-sectional view of the semiconductor structure 100 along the line A-A and FIG. 1c shows a schematic cross-sectional view of the semiconductor structure 100 along the line B-B.

The semiconductor structure 100 includes a substrate 101 that may be formed of a semiconductor material such as silicon, an electrically insulating layer 102 that may be formed of a dielectric material such as silicon dioxide, and a layer 103 of semiconductor material. The layer 103 of semiconductor material may include silicon or another semiconductor material, such as silicon/germanium, silicon/carbide or a III-V semiconductor material, such as gallium arsenide.

The substrate 101, the layer 102 of electrically insulating material and the layer 103 of semiconductor material form a semiconductor-on-insulator structure. In some embodiments, the semiconductor-on-insulator structure may be an extremely thin semiconductor-on-insulator (ETSOI) structure, wherein the layer 102 of electrically insulating material may be an ultra-thin buried oxide (UT-BOX) that has a thickness in a range from about 10-20 nm, and the layer 103 of semiconductor material has a thickness in a range from about 5-8 nm.

The semiconductor-on-insulator structure provided by the substrate 101, the layer 102 of electrically insulating material and the layer 103 of semiconductor material may be formed by methods of forming a semiconductor-on-insulator structure including a bonding of two wafers, wherein at least one of the wafers has a layer of the electrically insulating material of the layer 102 formed thereon, cleaving one of the wafers, optionally at a location wherein hydrogen has been implanted into the wafer, and polishing a semiconductor material of the cleaved wafer to provide a smooth surface of the layer 103 of semiconductor material that is formed of a portion of the cleaved wafer.

Figure 2A:
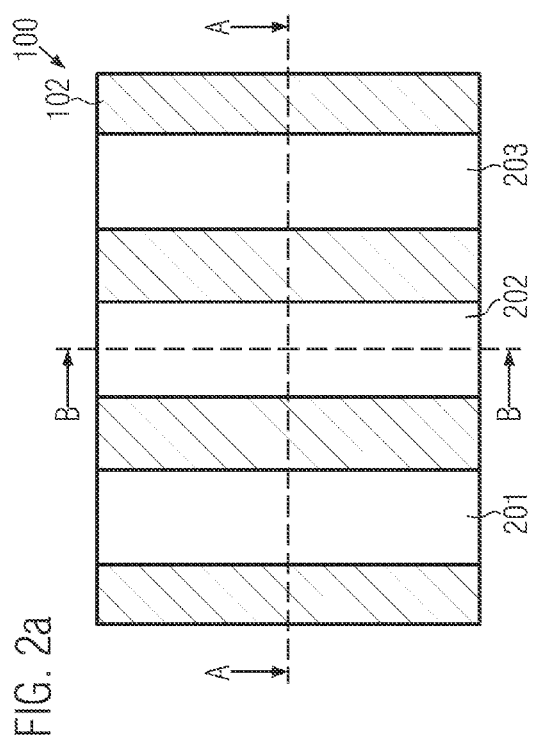
Figure 2B:
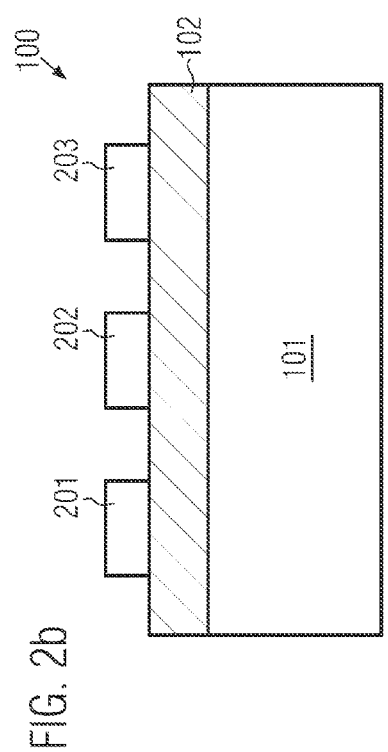

FIGS. 2a, 2b and 2c show schematic views of the semiconductor structure 100 in a later stage of the manufacturing process. FIG. 2a shows a schematic top view of the semiconductor structure 100, and FIGS. 2b and 2c show schematic cross-sectional views along the lines A-A and B-B, respectively.

The layer 103 of semiconductor material may be structured using techniques of photolithography and etching for forming elongated semiconductor lines 201, 202, 203. For this purpose, a mask (not shown) covering portions of the semiconductor structure 100 where the elongated semiconductor lines 201, 202, 203 are to be provided may be formed. This may be done by means of techniques of photolithography.

In embodiments wherein a width of the elongated semiconductor lines 201, 202, 203 is substantially smaller than a wavelength of light employed in the photolithography process, multiple patterning techniques may be used for the formation of the mask. Thereafter, an etch process may be performed. The etch process removes portions of the layer 103 of semiconductor material that are not covered by the mask. Portions of the layer 103 of semiconductor material covered by the mask are not removed in the etch process and form the elongated semiconductor lines 201, 202, 203.

The elongated semiconductor lines 201, 202, 203 have a longitudinal direction extending substantially along a horizontal direction (vertical in the top view of FIG. 2a and horizontal in the cross-sectional view of FIG. 2c) that is perpendicular to a thickness direction of the substrate 101 (vertical in the cross-sectional views of FIGS. 2b and 2c). An extension of the elongated semiconductor lines 201, 202, 203 in the longitudinal direction may be greater than an extension of the elongated semiconductor lines 201, 202, 203 in a width direction of the elongated semiconductor lines 201, 202, 203 (horizontal in the views of FIGS. 2a and 2b) and an extension of the elongated semiconductor lines 201, 202, 203 in the thickness direction of the substrate 101.

The extension of the elongated semiconductor lines 201, 202, 203 in the thickness direction may be substantially equal to the thickness of the layer 103 of semiconductor material from which they are formed.

The extension of the elongated semiconductor lines 201, 202, 203 in the width direction may be in the same range as the thickness of the layer 103 of semiconductor material from which the elongated semiconductor lines 201, 202, 203 are formed.

In some embodiments, the elongated semiconductor lines 201, 202, 203 may have a width in a range from about 5-8 nm, and may form nanowires. In other embodiments, the width of the elongated semiconductor lines 201, 202, 203 and/or the thickness of the elongated semiconductor lines 201, 202, 203 corresponding to the thickness of the layer 103 of semiconductor material from which they are formed may be greater.

Figure 3A:
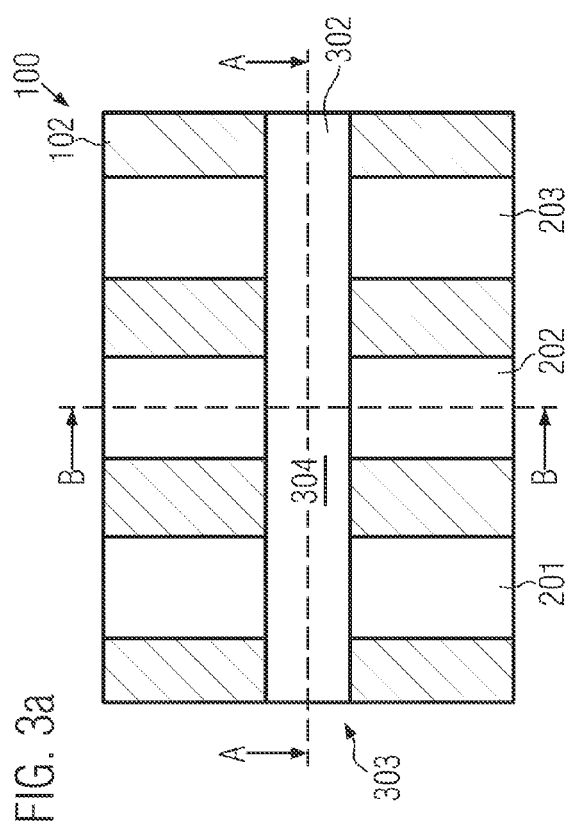
FIGS. 3a, 3b and 3c show a schematic top view and cross-sectional views, respectively, of a semiconductor structure according to an embodiment in a stage of a method according to an embodiment.
Figure 3B:
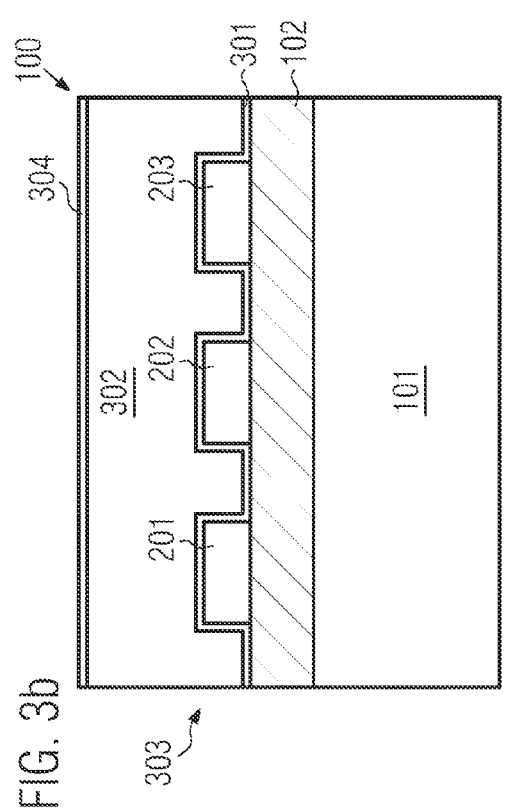
Figure 3C:
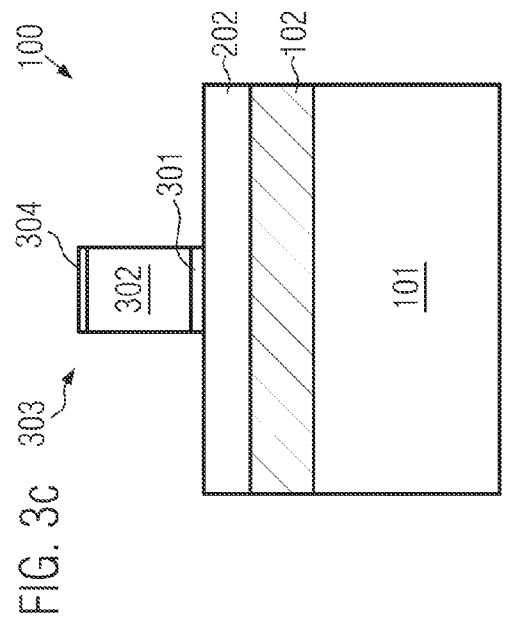

FIGS. 3a, 3b and 3c show schematic views of the semiconductor structure 100 in a later stage of the manufacturing process. FIG. 3a shows a schematic top view of the semiconductor structure 100, and FIGS. 3b and 3c show schematic cross-sectional views along the lines A-A and B-B, respectively.

A dummy gate structure 303 including a dummy gate insulation layer 301 and a dummy gate electrode 302 may be formed on the elongated semiconductor lines. In some embodiments, the dummy gate structure 303 may additionally include a cap layer 304 that is provided on the dummy gate electrode 302.

The dummy gate insulation layer 301 may be formed by depositing a layer of a material of the dummy gate insulation layer 301, for example a layer of silicon dioxide, having a thickness in a range from about 2-3 nm. Thereafter, a layer of a material of the dummy gate electrode 302, for example a layer of polysilicon, having a thickness in a range from about 40-60 nm may be formed. Thereafter, a layer of a material of the cap layer 304, for example a layer of silicon nitride, having a thickness in a range from about 4-10 nm may be formed. The layer of the material of the dummy gate insulation layer 301, the layer of the material of the dummy gate electrode 302 and the layer of the material of the cap layer 304 may be formed by means of deposition processes such as chemical vapor deposition and/or plasma enhanced vapor deposition. After the formation of the layer of the material of the dummy gate electrode 302, the layer of the material of the dummy gate electrode 302 may be planarized, for example, by means of a chemical mechanical polishing process.

Thereafter, the layers of the materials of the dummy gate insulation layer 301, the gate electrode 302 and the cap layer 304 may be patterned by means of photolithography and etching.

The dummy gate structure 303 may extend across the elongated semiconductor lines 201, 202, 203. An extension of the dummy gate structure 303 in the longitudinal direction of the elongated semiconductor lines 201, 202, 203 (vertical in the view of FIG. 3a and horizontal in the view of FIG. 3c) may be approximately equal to a channel length of a transistor to be formed in the semiconductor structure 100. The extension of the dummy gate structure 303 in the longitudinal direction of the elongated semiconductor lines 201, 202, 203 may be in a range from about 2-5 nm.

An extension of the dummy gate structure 303 in the width direction of the elongated semiconductor lines 201, 202, 203 (horizontal in the views of FIG. 3a and FIG. 3b) may be greater than the extension of the dummy gate structure 303 in the longitudinal direction of the elongated semiconductor lines 201, 202, 203, and may be adapted such that each of the elongated semiconductor lines 201, 202, 203 is covered by the dummy gate structure 303.

Figure 4C:
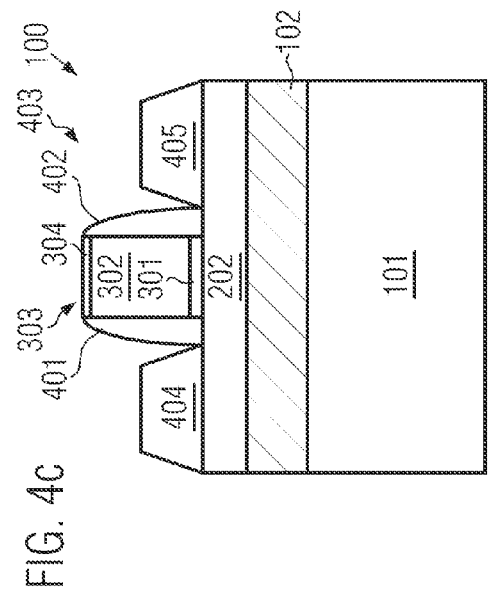
FIGS. 4a, 4b and 4c show a schematic top view and cross-sectional views, respectively, of a semiconductor structure according to an embodiment in a stage of a method according to an embodiment.
Figure 4A:
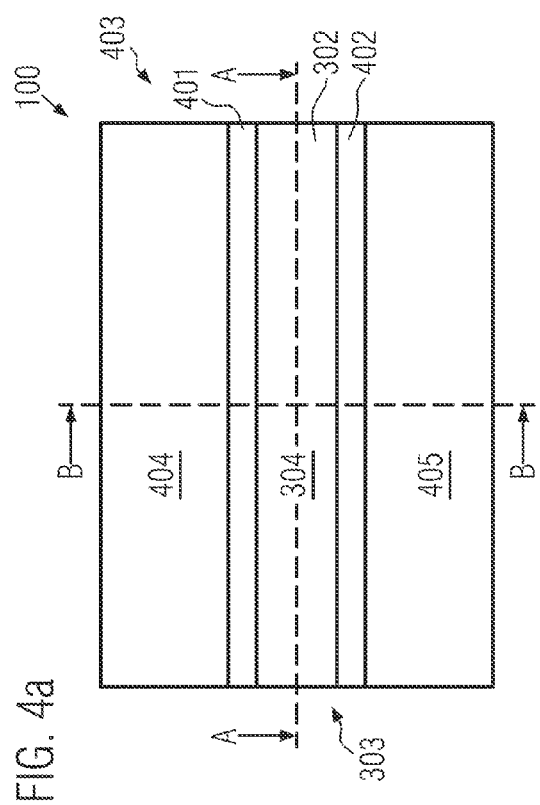
Figure 4B:
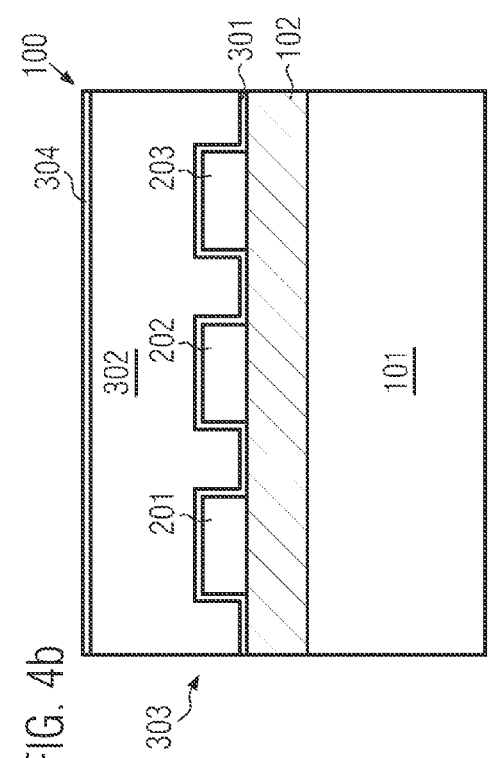

FIGS. 4a, 4b and 4c show schematic views of the semiconductor structure 100 in a later stage of the manufacturing process. FIG. 4a shows a schematic top view of the semiconductor structure 100, and FIGS. 4b and 4c show schematic cross-sectional views along the lines A-A and B-B, respectively.

A sidewall spacer 403 may be formed adjacent the dummy gate structure 303. The sidewall spacer 403 may include a portion 401 that is formed at a side of the dummy gate structure 303 that is substantially perpendicular to the longitudinal direction of the elongated semiconductor lines 201, 202, 203. Additionally, the sidewall spacer 303 includes a portion 402 at another side of the dummy gate structure 303 that is substantially perpendicular to the longitudinal direction of the elongated semiconductor lines 201, 202, 203 and opposite the side on which the portion 401 is provided. Moreover, the sidewall spacer 403 may include portions at sides of the dummy gate structure 303 that are substantially parallel to the longitudinal direction of the elongated semiconductor lines 201, 202, 203 (not shown in the figures which show a section of the semiconductor structure 100). Thus, the sidewall spacer 403 may be an integral feature, extending around the dummy gate structure 303.

The sidewall spacer 403 may be formed of the same material as the cap layer 304. For example, the sidewall spacer 403 and the cap layer 304 may be formed of silicon nitride.

The sidewall spacer 403 may be formed by substantially isotropically depositing a layer of the material of the sidewall spacer 403 on the semiconductor structure 100. In the isotropic deposition process, a rate at which material is deposited is substantially independent of the orientation of the surface on which the material is deposited. Examples of isotropic deposition processes include chemical vapor deposition and plasma enhanced chemical vapor deposition.

Thereafter, an anisotropic etch process may be performed. In anisotropic etching, an etch rate at which material is removed depends on an orientation of the surface of the material that is exposed to the etchant. Hence, in the anisotropic etch process, the material of the sidewall spacer 403 may be more quickly removed form substantially horizontal portions of the semiconductor structure 100, such as a surface of the dummy gate structure 303, a surface of the layer 102 of electrically insulating material exposed between the elongated semiconductor lines 201, 202, 203, and top surfaces of the elongated semiconductor lines 201, 202, 203 than on inclined portions of the semiconductor structure 100, such as sidewalls of the dummy gate structure 303.

The anisotropic etch process may be performed until the material of the sidewall spacer 403 is substantially removed from the horizontal portions of the semiconductor structure 100. Additionally, a slight overetch may be performed for removing the material of the sidewall spacer 403 from sidewalls of the elongated semiconductor lines 201, 202, 203. Portions of the layer of the material of the sidewall spacer 403 at the sidewalls of the dummy gate structure 303 are not removed in the anisotropic etch process and form the sidewall spacer 403.

After the formation of the sidewall spacer 403, a raised source region 404 and a raised drain region 405 may be formed. The raised source region 404 and the raised drain region 405 may be provided on opposite sides of the dummy gate structure 303.

The raised source region 404 and the raised drain region 405 may be formed by depositing an in situ doped semiconductor material on portions of the elongated semiconductor lines 201, 202, 203 adjacent the dummy gate structure 303. The type of dopant in the raised source region 404 and the raised drain region 405 may correspond to a type of transistor to be formed in the semiconductor structure 100. In particular, in embodiments wherein a P-channel field effect transistor is to be formed, the raised source region 404 and the raised drain region 405 may include a P-type dopant, and in embodiments wherein a N-channel field effect transistor is to be formed, the raised source region 404 and the raised drain region 405 may include an N-type dopant.

The material of the raised source region 404 and the raised drain region 405 may include substantially the same material as the material from which the elongated semiconductor lines 201, 202, 203 are formed.

Alternatively, different materials may be used for the raised source region 404 and the raised drain region 405, on the one hand, and for the elongated semiconductor lines 201, 202, 203, on the other hand, for providing a strain in the elongated semiconductor lines 201, 202, 203. For example, in embodiments wherein the elongated semiconductor lines 201, 202, 203 include silicon, the raised source and drain regions 404, 405 may be formed of silicon/germanium for providing a compressive stress in the elongated semiconductor lines 201, 202, 203, which may be helpful for improving the mobility of holes, or the raised source and drain regions 404, 405 may be formed of silicon/carbide, which may be helpful for providing a tensile stress. A tensile stress may improve the mobility of electrons.

The formation of the raised source region 404 and the raised drain region 405 may include a selective epitaxial growth process, wherein the material of the raised source region 404 and the raised drain region 405 is deposited on exposed portions of the elongated semiconductor lines 201, 202, 203, but substantially no deposition of material or only a deposition of a small amount of material occurs on portions of the semiconductor structure 100 which are formed of materials that are different from the semiconductor material of the elongated semiconductor lines 201, 202, 203.

Features formed of other materials than the elongated semiconductor lines 201, 202, 203 include, in particular, the cap layer 304 of the dummy gate structure 303 and the sidewall spacer 403. The cap layer 304 and the sidewall spacer 403 may encapsulate the dummy gate electrode 302 which may be formed of polysilicon, so that substantially no deposition of material or only a deposition of a small amount of material occurs on the dummy gate structure 303 and the sidewall spacer 403.

In the selective epitaxial growth process, the growth of semiconductor material on the exposed portions of the elongated semiconductor lines 201, 202, 203 may occur both in the thickness direction of the substrate 101 (vertical in FIGS. 4b and 4c) and in horizontal directions (horizontal in FIGS. 4b and 4c). Hence, the semiconductor material grown on the exposed portions of the elongated semiconductor lines 201, 202, 203 may grow over the gaps between the elongated semiconductor lines 201, 202, 203, so that the raised source region 404 and the raised drain region 405 cover the portions of the layer 102 of electrically insulating material between the elongated semiconductor lines 201, 202, 203, with the exception of those portions which are covered by the dummy gate structure 303 and the sidewall spacer 403.

In embodiments wherein the raised source region 404 and the raised drain region 405 include silicon, the selective epitaxial growth process employed for forming the raised source region 404 and the raised drain region 405 may be a chemical vapor deposition process or a plasma enhanced chemical vapor deposition process wherein a reactant gas including chlorine, such as $SiCl_4$, $SiHCl_3$ or $SiH_2Cl_2$, is used. Alternatively, a chemical compound including chlorine, such as HCl, may be used in addition to a reactant including silicon, such as $SiH_4$ or $Si_2H_6$.

Chlorine atoms may react chemically with silicon adatoms on silicon dioxide (for example, on exposed portions of the layer 102 of the electrically insulating material) or silicon nitride (for example, on the sidewall spacer 403 or the cap layer 304 of the dummy gate structure 303). In the chemical reaction, gaseous reaction products are formed, which are not bound to the surface of the semiconductor structure 100. Silicon deposited on the elongated semiconductor lines 201, 202, 203 may remain on the semiconductor structure 100 and form the raised source region 404 and the raised drain region 405.

As an alternative to a chemical vapor deposition process or plasma enhanced chemical vapor deposition process, molecular beam epitaxy (MBE) and/or metal organic chemical vapor deposition (MOCVD) may be employed for forming the raised source region 404 and the raised drain region 405.

In embodiments wherein the raised source region 404 and the raised drain region 405 include a compound semiconductor material, such as silicon/germanium or silicon/carbide, chemical vapor deposition, plasma enhanced chemical vapor deposition, molecular beam epitaxy or metal organic chemical vapor deposition may also be employed for forming the raised source region 404 and the raised drain region 405.

As already mentioned above, the selective epitaxial growth process used for the formation of the raised source region 404 and the raised drain region 405 may be adapted such that the semiconductor material of the raised source region 404 and the raised drain region 405 is in situ doped. For this purpose, a dopant species, which may be a chemical compound including a dopant or a dopant in atomic or molecular form may be supplied during the selective epitaxial growth process. The dopant is incorporated into the semiconductor material of the raised source region 404 and the raised drain region 405.

For providing an N-type dopant, such as phosphorus (P) or arsenic (As), in the raised source region 404 and the raised drain region 405, a dopant species, such as phosphine ($PH_3$) or arsine ($AsH_3$), may be supplied during the selective epitaxial growth process. For providing a P-type dopant, such as boron, a dopant species, such as boron, boron difluoride ($BF_2$) and/or diborane ($B_2H_6$), may be supplied during the selective epitaxial growth process.

In some embodiments, portions of the semiconductor structure 100 which are not shown in FIGS. 4a to 4c may be covered by a mask, for example, a hardmask including silicon nitride, during the formation of the raised source region 404 and the raised drain region 405, and the portion of the semiconductor structure 100 shown in FIGS. 4a to 4c may be covered by a mask, for example, a hardmask, when raised source and drain regions similar to raised source and drain regions 404, 405 are formed in the other portions of the semiconductor structure 100. Thus, differently doped raised source and drain regions and/or raised source and drain regions formed from different materials for providing a different type of strain may be formed in different portions of the semiconductor structure 100.

FIGS. 5a, 5b and 5c show schematic views of the semiconductor structure 100 in a later stage of the manufacturing process. FIG. 5a shows a schematic top view of the semiconductor structure 100, and FIGS. 5b and 5c show schematic cross-sectional views along the lines A-A and B-B, respectively.

After the formation of the raised source region 404 and the raised drain region 405, an anneal process, for example a rapid thermal annealing process, may be performed for diffusing dopants from the raised source region 404 and the raised drain region 405 into portions of the elongated semiconductor lines 201, 202, 203 adjacent the dummy gate structure 303. Thus, a source region 503 and a drain region 504 may be formed in each of the elongated semiconductor lines 201, 202, 203.

Since dopants from the raised source region 404 and the raised drain region 405 may diffuse both in directions parallel to the thickness direction of the substrate 101 (vertical in the views of FIGS. 5b and 5c) and in horizontal directions (horizontal in the views of FIGS. 5b and 5c), portions of the source region 503 and the drain region 504 may extend below the dummy gate structure 303. A distance over which the dopants from the raised source region 404 and the raised drain region 405 diffuse in the longitudinal direction of the elongated semiconductor lines 201, 202, 203 may be substantially smaller than the width of the dummy gate structure 303 in the longitudinal direction. Thus, a portion of each of the elongated semiconductor lines 201, 202, 203 below the center of the dummy gate structure 303 may remain substantially undoped, or the portion of each of the elongated semiconductor lines 201, 202, 203 below the center of the dummy gate structure 303 may be approximately equal to an initial doping of the layer 103 of semiconductor material.

Thus, a channel region that is differently doped than the source region 503 and the drain region 504 may be provided in a central portion of each of the elongated semiconductor lines 201, 202, 203 that is located below the dummy gate structure 303. The channel regions are provided between the source regions 503 and the drain regions 504, which are located in end portions of the elongated semiconductor lines 201, 202, 203 that protrude from below the dummy gate structure 303. In some embodiments, the annealing process employed for forming the source region 503 and the drain region 504 in each of the elongated semiconductor lines 201, 202, 203 may be performed at a temperature in a range from about 550-700° C. and may be performed for a time in a range from about 15-45 minutes.

After the formation of the source regions 503 and the drain regions 504, silicide portions 501, 502 may be formed in the raised source region 404 and the raised drain region 405. A layer including nickel, cobalt, platinum, titanium, tungsten and/or an alloy of nickel and platinum may be deposited over the semiconductor structure 100, and a further annealing process may be performed for inducing a chemical reaction between the metal and the semiconductor material in the raised source region 404 and the raised drain region 405. Thereafter, portions of the metal which have not reacted with semiconductor material may be removed by an etch process.

During the formation of the silicide portions 501, 502 in the raised source region 404 and the raised drain region 405, the cap layer 304 and the sidewall spacer 403 may substantially prevent a contact between the metal deposited over the semiconductor structure 100 and the dummy gate structure 302. Thus, a formation of silicide in the dummy gate electrode 302 may be substantially avoided.

The source regions 503 and the drain regions 504 need not be formed by means of a separate annealing process that is performed before the formation of the silicide portions 501, 502 as described above. Alternatively, the annealing process used in the formation of the silicide portions 501, 502 may be adapted such that dopants from the raised source region 404 and the raised drain region 405 diffuse into the elongated semiconductor lines 201, 202, 203 and form the source regions 503 and the drain regions 504. Thus, a smaller amount of annealing processes may be required in the formation of the semiconductor structure 100.

Figure 6C:
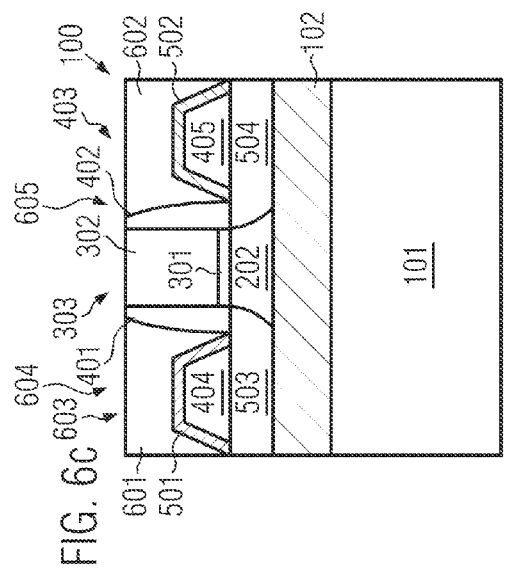
FIGS. 6a, 6b and 6c show a schematic top view and cross-sectional views, respectively, of a semiconductor structure according to an embodiment in a stage of a method according to an embodiment.
Figure 6A:
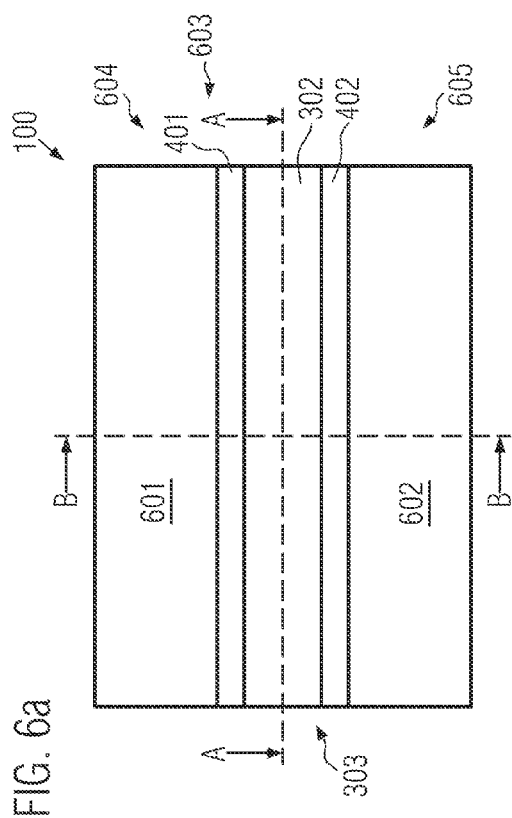
Figure 6B:
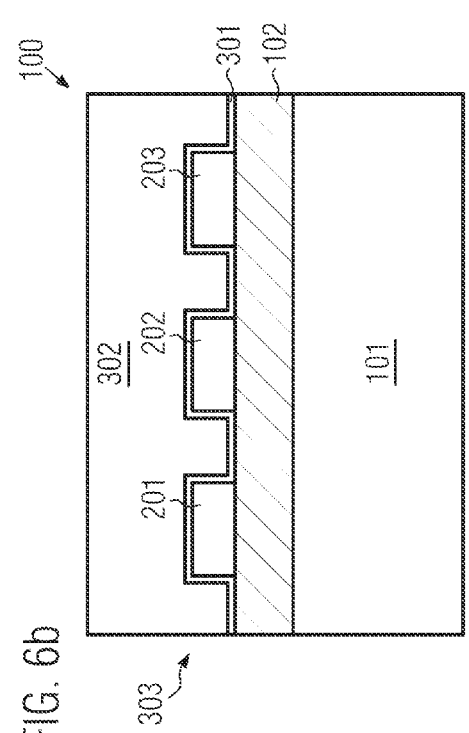

FIGS. 6a, 6b and 6c show schematic views of the semiconductor structure 100 in a later stage of the manufacturing process. FIG. 6a shows a schematic top view of the semiconductor structure 100, and FIGS. 6b and 6c show schematic cross-sectional views along the lines A-A and B-B, respectively.

After the formation of the silicide portions 501, 502 in the raised source region 404 and the raised drain region 405, a dielectric layer 603 may be formed on the semiconductor structure 100. The dielectric layer 603 may include silicon dioxide and may be formed by means of a chemical vapor deposition process or plasma enhanced chemical vapor deposition process wherein tetraethyl orthosilicate (TEOS) is used as a reactant. Alternatively, the dielectric layer 603 may include silicon nitride and/or silicon oxynitride. In such embodiments, a chemical vapor deposition process or plasma enhanced chemical vapor deposition process may be used for depositing the silicon nitride and/or silicon oxynitride, respectively, of the dielectric layer 603.

After the formation of the dielectric layer 603, the dielectric layer 603 may cover the raised source region 404, the raised drain region 405 and the dummy gate structure 303, and it may include a bulge above the dummy gate structure 303, which is caused by the topology of the portions of the semiconductor structure 100 on which the dielectric layer 603 is formed.

A planarization process, for example a chemical mechanical polishing process, may be performed for providing a substantially planar surface of the semiconductor structure 100. In the chemical mechanical polishing process, portions of the dielectric layer 603 above the dummy gate structure 303 may be removed. Moreover, the planarization process may remove the cap layer 304 from the dummy gate electrode 302, so that the dummy gate electrode 302 is exposed. Portions 601, 602 of the dielectric layer 603 over the raised source region 404 and the raised drain region 405 remain on the semiconductor structure 100 and obtain a substantially planar surface in the planarization process.

The raised source region 404, the silicide portion 501, the portion 601 of the dielectric layer 603 and the portion 401 of the sidewall spacer 403 form a feature 604 covering end portions of each of the elongated semiconductor lines 201, 202, 203 wherein the source regions 503 are provided. The raised drain region 405, the silicide portion 502, the portion 602 of the dielectric layer 603 and the portion 402 of the sidewall spacer 403 form another feature 605 covering end portions of the elongated semiconductor lines 201, 202, 203 wherein the drain regions 504 are formed. At the surfaces of the features 604, 605, materials of the dielectric layer 603 and the sidewall spacer 403 are exposed, which may encapsulate the end portions of the elongated semiconductor lines 201, 202, 203, the raised source and drain regions 404, 405 and the silicide portions 501, 502.

Figure 7A:
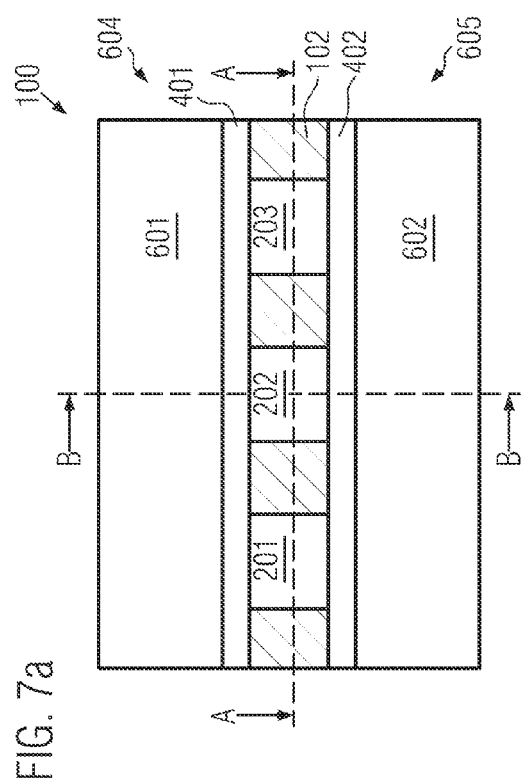
FIGS. 7a, 7b and 7c show a schematic top view and cross-sectional views, respectively, of a semiconductor structure according to an embodiment in a stage of a method according to an embodiment.
Figure 7B:
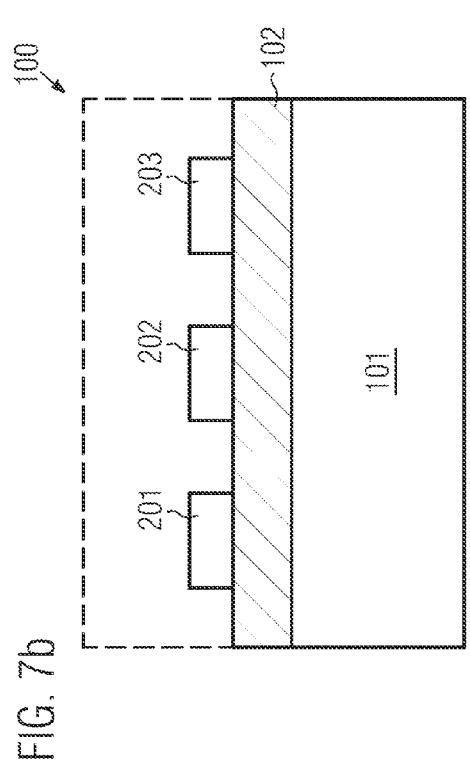
Figure 7C:
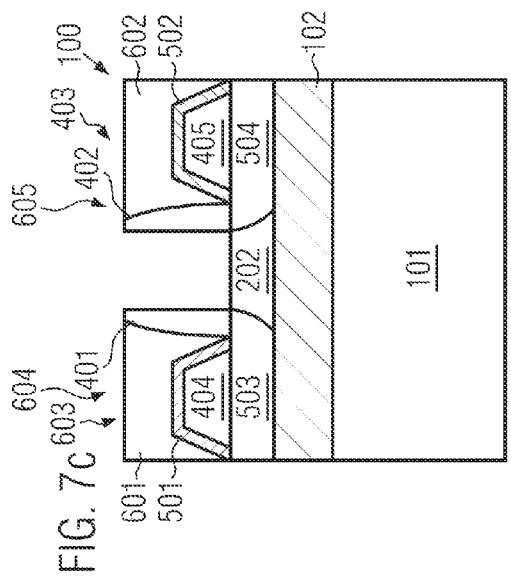

FIGS. 7a, 7b and 7c show schematic views of the semiconductor structure 100 in a later stage of the manufacturing process. FIG. 7a shows a schematic top view of the semiconductor structure 100, and FIGS. 7b and 7c show schematic cross-sectional views along the lines A-A and B-B, respectively.

After the planarization process, the dummy gate electrode 302 and the dummy gate insulation layer 301 may be removed. This may be done by means of a first etch process adapted to selectively remove the material of the dummy gate electrode 302 relative to the materials of the dielectric layer 603 and the sidewall spacer 401 and a second etch process adapted to selectively remove the material of the dummy gate insulation layer 301 relative to the material of the elongated semiconductor lines 201, 202, 203.

The removal of the dummy gate electrode 302 and the dummy gate insulation layer 301 forms a recess in the semiconductor structure 100. At the bottom of the recess, the central portions of the elongated semiconductor lines 201, 202, 203 and portions of the layer 102 of electrically insulating material between the central portions of the elongated semiconductor lines 201, 202, 203 are exposed. The source regions 503, portions of the layer 102 of electrically insulating material between the source regions 503, the drain regions 504 and portions of the layer 102 of electrically insulating material between the drain regions 504 remain covered by features 604, 605.

FIGS. 8a, 8b and 8c show schematic views of the semiconductor structure 100 in a later stage of the manufacturing process. FIG. 8a shows a schematic top view, and FIGS. 8b and 8c show schematic cross-sectional views along the lines A-A and B-B, respectively.

An etch process may be performed. The etch process is adapted to selectively remove the material of the layer 102 of electrically insulating material relative to the material of the elongated semiconductor lines 201, 202, 203 and/or the materials of the sidewall spacer 403 and/or the dielectric layer 603 which are exposed at the surfaces of the features 604, 605.

In embodiments wherein the layer 102 of electrically insulating material includes silicon dioxide and the sidewall spacer 403 and the dielectric layer 603 includes silicon nitride, the etch process may be adapted to selectively remove silicon dioxide relative to the semiconductor material of the elongated semiconductor lines 201, 202, 203 and silicon nitride.

In embodiments wherein the dielectric layer 603 includes silicon dioxide and/or silicon oxynitride, a relatively large thickness of the portions 601, 602 of the dielectric layer 603 over the raised source region 404 and the raised drain region 405 may be provided, so that the raised source and drain regions 404, 405 and the silicide portions 501, 502 thereof are not exposed during the etch process, although some removal of material of the portions 601, 602 of the dielectric layer 603 may occur during the etch process.

The etch process may be substantially isotropic. Due to the isotropy of the etch process, an efficient removal of portions of the layer 102 of electrically insulating material below the central portions of the elongated semiconductor lines 201, 202, 203 may be obtained.

In some embodiments, the etch process for selectively removing the electrically insulating material of the layer 102 may be a plasma etch process. In some embodiments, the plasma etch process may be a remote plasma process, wherein the semiconductor structure 100 is provided in a reaction chamber and is exposed to a plasma that is created from a reactant gas in a plasma generation chamber that is separate from the reaction chamber. Alternatively or additionally, a plasma etch process wherein the plasma is created from the reactant gas directly in the reaction chamber, for example by means of a radio frequency electric discharge, may be performed. The selectivity of the etch process may be obtained by an appropriate selection of the composition of the reactant gas and other parameters of the etch process such as, for example, temperature and pressure of the reactant gas and/or the power of the electric discharge employed for creating the plasma. In some embodiments, a reactant gas including $CF_4$, $SF_6$ and/or $NF_3$ may be employed for selectively etching silicon dioxide relative to silicon and silicon nitride.

The etch process for selectively removing the electrically insulating material of the layer 102 need not be a dry etch process, such as a remote plasma etch process or a plasma etch process. In other embodiments, a wet etch process may be employed. For example, diluted hydrofluoric acid may be used for selectively removing silicon dioxide relative to silicon and silicon nitride.

Due to the isotropy of the etch process, the etch process may remove portions of the layer 102 of electrically insulating material below the elongated semiconductor lines 201, 202, 203. Additionally, the etch process may remove portions of the layer 102 of electrically insulating material below the features 604, 605. Thus, in the etch process, an opening 801 in the layer 102 of electrically insulating material may be formed that includes parts 803, 804 extending below the source and drain regions 503, 504 in the elongated semiconductor lines 201, 202, 203 and/or below the portions 401, 402 of the sidewall spacer 403, the raised source region 404 and the raised drain region 405. In FIG. 8a, dashed lines 802 schematically show the extension of the opening 801.

As can be seen from FIG. 8a, the opening 801 may extend below the sidewall spacer 403, the raised source region 404 and the raised drain region 405 to a smaller extent below the elongated semiconductor lines 201, 202, 203 than at the gaps between the elongated semiconductor lines 201, 202, 203. This may be caused by the influence of the elongated semiconductor lines 201, 202, 203 on the etch process.

Moreover, from FIGS. 8a and 8c, it can be seen that an extension of opening 801 along the longitudinal direction of the elongated semiconductor lines 201, 202, 203 (vertical in FIG. 8a and horizontal in FIG. 8c) may be greater than an extension of the recess between the portions 401, 402 of the sidewall spacer 403 that was formed by the removal of the dummy gate electrode 302 and the dummy gate insulation layer 301.

The extension of the opening 801 below the source and drain regions 503, 504 and the raised source and drain regions 404, 405 may be controlled by an appropriate selection of the amount of etching of the electrically insulating material of the layer 102. In some embodiments, a plurality of semiconductor structures similar to semiconductor structure 100 may be formed using techniques as described above, and parameters of etch processes that are employed for forming openings similar to opening 801, such as a duration of the etching may be varied. Thereafter, the semiconductor structure 100 may be analyzed, for example, by means of techniques of electron microscopy, for determining the extension of the opening 801.

The amount of etching of the electrically insulating material 102 may be optimized for obtaining a suitable extension of the opening 801, wherein not too much of the electrically insulating material of the layer 102 below the source and drain regions 503, 504 and the raised source and drain regions 404, 405 is removed, but the electrically insulating material from the layer 102 is substantially completely removed from the central portions of the elongated semiconductor lines 201, 202, 203 wherein the channel regions are provided, as described above.

Thus, after the etch process, the central portions of the elongated semiconductor lines 201, 202, 203 comprising the channel regions are "hanging" freely between the source regions 503 and the drain regions 504, and substantially no material is provided all around the channel regions formed in the elongated semiconductor lines 201, 202, 203.

Figure 9A:
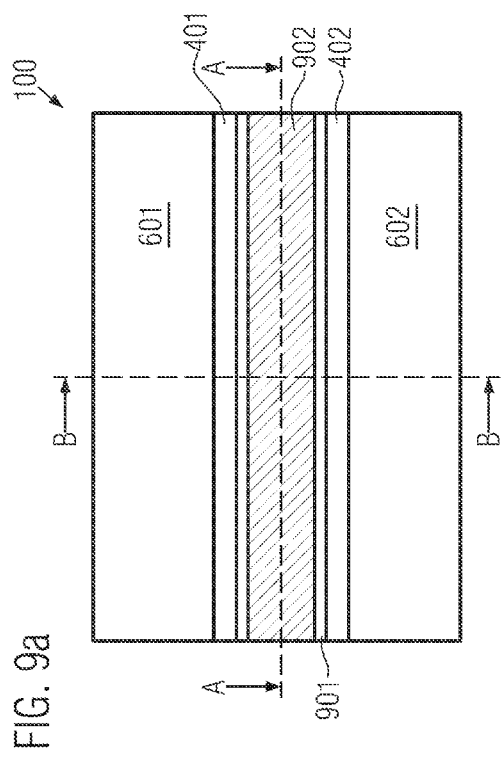
FIGS. 9a, 9b and 9c show a schematic top view and cross-sectional views, respectively, of a semiconductor structure according to an embodiment in a stage of a method according to an embodiment.
Figure 9C:
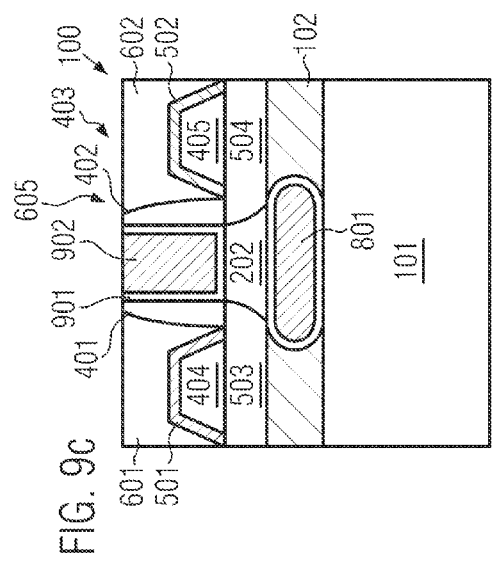
Figure 9B:
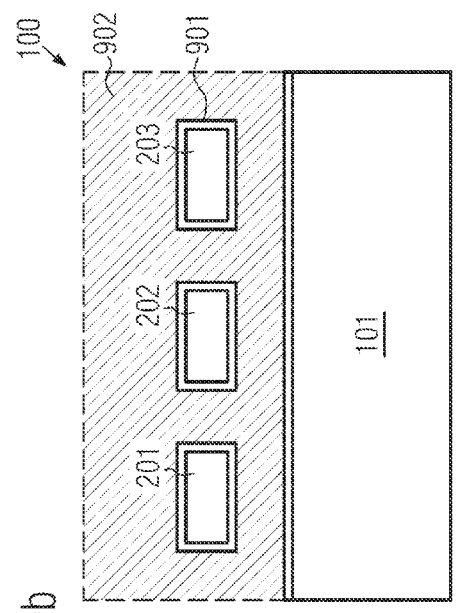

FIGS. 9a, 9b and 9c show schematic views of the semiconductor structure 100 in a later stage of the manufacturing process. FIG. 9a shows a schematic top view, FIG. 9b shows a schematic cross-sectional view along the line A-A and FIG. 9c shows a schematic cross-sectional view along the line B-B.

After removing the portion of the layer 102 of electrically insulating material below the central portions of the elongated semiconductor lines 201, 202, 203, which may be done by means of an etch process as described above with reference to FIGS. 8a-8c, a gate insulation layer 901 may be formed.

The gate insulation layer 901 may include an electrically insulating material, for example, silicon dioxide. Alternatively and/or additionally, the gate insulation layer 901 may include a high-k material having a greater dielectric constant than silicon dioxide, for example, a dielectric constant greater than about 4. Examples of high-k materials include hafnium dioxide, hafnium silicon oxynitride and zirconium dioxide.

The gate insulation layer 901 may be formed by means of a substantially isotropic deposition process, for example, by means of a chemical vapor deposition process. Features of the chemical vapor deposition process employed for the formation of the gate insulation layer 901 may correspond to features of chemical vapor deposition processes employed in the formation of gate insulation layers that are used in conventional planar transistors, FinFET transistors and/or tri-gate transistors.

Due to the isotropy of the deposition process, the gate insulation layer 901 may cover all exposed surfaces of the elongated semiconductor lines 201, 202, 203 so that, after the formation of the gate insulation layer 901, no semiconductor material of the elongated semiconductor lines 201, 202, 203 is exposed. Additionally, the gate insulation layer 901 may cover sidewalls of the sidewall spacers 401, 402 and surfaces of the opening 801 formed in the layer 102 of electrically insulating material. In particular, the gate insulation layer 901 may cover a bottom surface of the opening 801 where the substrate 101 may be exposed. Thus, the gate insulation layer 901 may provide electrical insulation between a gate electrode, the formation of which will be described below, and the substrate 101 which, as described above, may include a semiconductor material.

The gate insulation layer 901 need not be formed by means of a chemical vapor deposition process. Alternatively or additionally, a thermal oxidation process may be used for forming the gate insulation layer. For performing the thermal oxidation process, the semiconductor structure 100 may be provided in an oxidizing ambient, for example, a gas including oxygen and/or water vapor and an annealing process may be performed for initiating a chemical reaction between the semiconductor material of the elongated semiconductor lines 201, 202, 203 and the oxidizing ambient so that an oxide of the semiconductor material, for example silicon dioxide, is formed. The oxidizing ambient may also react chemically with material of the substrate 101 exposed at the bottom of opening 801, so that an electrically insulating layer providing electrical insulation between the gate electrode and the substrate 101 may be provided.

After the formation of the gate insulation layer 901, a gate electrode 902 may be formed.

In some embodiments, the gate electrode 902 may include a metal, wherein the particular metal that is used for the formation of the gate electrode 902 may be adapted to the type of transistor to be formed in the semiconductor structure 100. If an N-channel transistor is to be formed, the gate electrode 902 may include lanthanum, lanthanum nitride and/or titanium nitride. If a P-channel transistor is to be formed in the semiconductor structure 100, the gate electrode 902 may include aluminum, aluminum nitride and/or titanium nitride.

In further embodiments, the gate electrode 902 may be formed of a semiconductor material, for example, polysilicon.

For forming the gate electrode 902, a substantially isotropic deposition process, for example, a chemical vapor deposition process or a plasma enhanced chemical vapor deposition process may be performed. Due to the isotropy of the deposition process, a complete filling of the opening 801 in the layer 102 of electrically insulating material, the gaps between the elongated semiconductor lines 201, 202, 203 and the space between the portions 401, 402 of the sidewall spacer 403 may be obtained. Thus, a formation of voids in the semiconductor structure 100 which could be sources of defects or leakage paths may be avoided.

After the deposition of the material of the gate electrode 902, a planarization process, for example a chemical mechanical polishing process, may be performed for removing portions of the material of the gate electrode 902 that has been deposited on top of the portions 601, 602 of the dielectric layer 603. Additionally, the planarization process may remove portions of the gate insulation layer 901 deposited on the portions 601, 602 of the dielectric layer 603.

Thereafter, the semiconductor structure includes a field effect transistor. A source of the field effect transistor is provided by the source regions 503 in the elongated semiconductor lines 201, 202, 203 and the raised source region 404, and a drain of the field effect transistor is provided by the drain regions 504 in the elongated semiconductor lines 201, 202, 203 and the raised drain region 405. A channel of the field effect transistor is provided by the channel regions between the source regions 503 and the drain regions 504 in the elongated semiconductor lines 201, 202, 203. The electrical conductivity of the channel of the field effect transistor may be controlled by a voltage applied between the gate electrode 902 and the source.

Since the gate electrode 902 includes portions above each of the elongated semiconductor lines 201, 202, 203, below each of the elongated semiconductor lines 201, 202, 203 and adjacent each of the elongated semiconductor lines 201, 202, 203, the gate electrode 902 is provided all around each of the channel regions formed in the elongated semiconductor lines 201, 202, 203. Thus, an improved controllability of the channel of the transistor as compared to planar field effect transistors, FinFET transistors and tri-gate transistors, wherein there are one or more surfaces of the channel that are not covered by the gate electrode, may be obtained.

Moreover, the arrangement of the raised source region 404, the raised drain region 405 and the gate electrode 902 relative to each other may be similar to the relative arrangement of raised source and drain regions and a gate electrode in a conventional planar transistor. Thus, electrical connection to the transistor may be made in a manner similar to electrical connections to conventional planar field effect transistors.

The present disclosure is not limited to embodiments wherein there are three elongated semiconductor lines 201, 202, 203 as described above. In other embodiments, a smaller number of elongated semiconductor lines, for example one or two, or a number of elongated semiconductor lines greater than two may be provided per transistor.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming one or more elongated semiconductor lines on a layer of electrically insulating material, said layer of electrically insulating material being provided over a substrate comprising a different material than the layer of electrically insulating material, wherein a longitudinal direction of each of said one or more elongated semiconductor lines extends substantially along a horizontal direction that is perpendicular to a thickness direction of said substrate;
    removing a portion of said layer of electrically insulating material below a central portion of each of said one or more elongated semiconductor lines to expose said substrate;
    forming a gate insulation layer on said central portion of each of said one or more elongated semiconductor lines and said exposed portion of said substrate; and
    forming a gate electrode extending all around said central portion of each of said one or more elongated semiconductor lines, said gate insulation layer providing electrical insulation between said elongated semiconductor lines and said gate electrode and between said gate electrode and said exposed portion of said substrate.

2. The method of claim 1, wherein removing the portion of said layer of electrically insulating material below said central portion of each of said one or more elongated semiconductor lines comprises:
    forming a first feature over a first end portion of each of said one or more elongated semiconductor lines;
    forming a second feature over a second end portion of each of said one or more elongated semiconductor lines, wherein the central portion of each of said one or more elongated semiconductor lines and a portion of said layer of electrically insulating material are exposed between said first and the second feature; and
    performing an etch process adapted to selectively remove a material of said layer of electrically insulating material relative to a material of said one or more elongated semiconductor lines and one or more materials exposed at surfaces of said first and the second feature.

3. The method of claim 2, wherein said etch process is substantially isotropic.

4. The method of claim 3, wherein said first feature comprises a raised source region, a first portion of a sidewall spacer formed above the first end portion of each of said one or more elongated semiconductor lines, and a first portion of a layer of dielectric material formed above said raised source region; and wherein the second feature comprises a raised drain region, a second portion of the sidewall spacer formed above the second end portion of each of said one or more elongated semiconductor lines, and a second portion of a layer of dielectric material formed above said raised drain region.

5. The method of claim 4, wherein the formation of said first feature and said second feature comprises:

forming a dummy gate structure over the central portion of each of said elongated semiconductor lines;

forming the sidewall spacer adjacent said dummy gate structure;

performing a selective growth process, said selective growth process forming said raised source region and said raised drain region;

depositing the layer of dielectric material over said dummy gate structure, said raised source region and said raised drain region;

planarizing the layer of dielectric material, wherein the planarization exposes said dummy gate structure; and performing one or more etch processes to selectively remove said dummy gate structure.

6. The method of claim 5, further comprising forming a silicide in said raised source region and said raised drain region before the deposition of said layer of dielectric material.

7. The method of claim 5, further comprising in situ doping said raised source region and said raised drain region during said selective growth process.

8. The method of claim 7, further comprising performing an annealing process, wherein dopants from said raised source region diffuse into the first end portion of each of said elongated semiconductor lines and form a source region, and dopants from said raised drain region diffuse into the second end portion of each of said elongated semiconductor lines and form a drain region.

9. The method of claim 1, wherein the formation of said one or more elongated semiconductor lines comprises:

providing a semiconductor-on-insulator structure, said semiconductor-on-insulator structure comprising a layer of a semiconductor material, said substrate and said layer of electrically insulating material, said layer of electrically insulating material being provided between said substrate and said layer of semiconductor material; and performing an etch process, said etch process removing portions of said layer of semiconductor material, wherein one or more other portions of said layer of semiconductor material are not removed in said etch process and form said one or more elongated semiconductor lines.

10. The method of claim 1, wherein said gate insulation layer comprises a high-k material having a greater dielectric constant than silicon dioxide and said gate electrode comprises a metal.

11. The method of claim 1, wherein forming said gate insulation layer comprises performing a thermal oxidation process.

12. The method of claim 1, wherein forming said gate insulation layer comprises performing a chemical vapor deposition process.

13. A method, comprising:

forming an elongated semiconductor line on a layer of electrically insulating material that is positioned on a substrate comprised of a semiconductor material, wherein a longitudinal direction of said one elongated semiconductor line extends substantially along a horizontal direction that is perpendicular to a thickness direction of said substrate;

forming a dummy gate structure over the central portion of said elongated semiconductor line;

forming a sidewall spacer adjacent said dummy gate structure;

performing a selective growth process to form a raised source region above a first end portion of said elongated semiconductor line and a raised drain region above a second end portion of said elongated semiconductor line;

depositing a layer of dielectric material over said dummy gate structure, said raised source region and said raised drain region;

planarizing the layer of dielectric material, wherein the planarization exposes said dummy gate structure;

performing one or more etch processes to selectively remove said dummy gate structure to expose a central portion of said elongated semiconductor line and thereby define a gate cavity laterally defined by the sidewall spacers;

performing an etching process through the gate cavity to remove at least a portion of said layer of electrically insulating material below said central portion to expose said substrate;

forming a gate insulation layer on said central portion of said elongated semiconductor line and said exposed portion of said substrate; and forming a gate electrode extending all around said central portion of said elongated semiconductor line, said gate insulation layer providing electrical insulation between said elongated semiconductor line and said gate electrode and between said gate electrode and said previously exposed portion of said substrate.

14. The method of claim 13, wherein forming said gate insulation layer comprises performing a thermal oxidation process.

15. The method of claim 13, wherein forming said gate insulation layer comprises performing a chemical vapor deposition process.

16. The method of claim 13, wherein said etching process is substantially isotropic.

17. The method of claim 13, further comprising forming a silicide in said raised source region and said raised drain region before the deposition of said layer of dielectric material.

18. The method of claim 13, further comprising in situ doping said raised source region and said raised drain region during said selective growth process.

19. The method of claim 13, further comprising performing an annealing process, wherein dopants from said raised source region diffuse into the first end portion of said elongated semiconductor line and form a source region, and dopants from said raised drain region diffuse into the second end portion of said elongated semiconductor line and form a drain region.

20. The method of claim 13, wherein the formation of said elongated semiconductor line comprises:
   providing a semiconductor-on-insulator structure, said semiconductor-on-insulator structure comprising a layer of a semiconductor material, said substrate and said layer of electrically insulating material, said layer of electrically insulating material being provided between said substrate and said layer of semiconductor material;
   forming a patterned masking layer above the layer of semiconductor material; and
   performing an etch process through the patterned masking layer to remove exposed portions of said layer of semiconductor material, thereby resulting in the formation of the elongated semiconductor line.

\* \* \* \* \*